United States Patent [19]
Ashby et al.

[11] Patent Number: 4,648,938
[45] Date of Patent: Mar. 10, 1987

[54] COMPOSITION/BANDGAP SELECTIVE DRY PHOTOCHEMICAL ETCHING OF SEMICONDUCTOR MATERIALS

[75] Inventors: Carol I. H. Ashby, Edgewood; James L. Dishman, Albuquerque, both of N. Mex.

[73] Assignee: The United States of America as represented by the United States Department of Energy, Washington, D.C.

[21] Appl. No.: 786,560

[22] Filed: Oct. 11, 1985

[51] Int. Cl.$^4$ .......................................... H01L 21/306
[52] U.S. Cl. .................... 156/643; 156/646; 156/655; 156/662
[58] Field of Search .................. 29/569 L, 580; 204/192 E; 156/643, 646, 655, 662

[56] References Cited

U.S. PATENT DOCUMENTS

| | | | |
|---|---|---|---|
| 3,364,087 | 1/1968 | Solomon et al. | 156/4 |
| 4,326,911 | 4/1982 | Howard et al. | 156/643 |
| 4,331,504 | 5/1982 | Chuang et al. | 156/643 |
| 4,351,706 | 9/1982 | Chappell et al. | 156/643 |
| 4,404,072 | 9/1983 | Kohl et al. | 156/643 |
| 4,454,004 | 6/1984 | Hackleman et al. | 156/643 |

OTHER PUBLICATIONS

Kern, "Chemical Etching . . . Gallium Phosphide", RCA Review 39, (1978), pp. 278–308.
Houle, "Non-Thermal Effects in Laser-Enhanced Etching of Silicon by XeF$_2$", Chem. Phys. Lett. 95, (1983), pp. 5–8.

*Primary Examiner*—Ivars Cintins
*Attorney, Agent, or Firm*—Armand McMillan; Albert Sopp; Judson R. Hightower

[57] ABSTRACT

A method of selectively photochemically dry etching a first semiconductor material of a given composition and direct bandgap $Eg_1$ in the presence of a second semiconductor material of a different composition and direct bandgap $Eg_2$, wherein $Eg_2 > Eg_1$, said second semiconductor material substantially not being etched during said method, comprises subjecting both materials to the same photon flux and to the same gaseous etchant under conditions where said etchant would be ineffective for chemical etching of either material were the photons not present, said photons being of an energy greater than $Eg_1$ but less than $Eg_2$, whereby said first semiconductor material is photochemically etched and said second material is substantially not etched.

15 Claims, No Drawings

COMPOSITION/BANDGAP SELECTIVE DRY PHOTOCHEMICAL ETCHING OF SEMICONDUCTOR MATERIALS

The U.S. Government has rights in this invention pursuant to Contract No. DE-AC04-76DP00789 between the U.S. Department of Energy and AT&T Technologies, Inc.

CROSS REFERENCE TO RELATED APPLICATION

This application is related to U.S. Ser. No. 786,563 filed on same date, and which disclosure is incorporated by reference herein.

BACKGROUND OF THE INVENTION

This application relates to a new dry technique for selectively photoetching a desired semiconductor material in the presence of other semiconductor materials. In a preferred embodiment, all materials have III–V compositions.

Device structures involving layers of binary, ternary, and quaternary compound semiconductors have become important in current device technology. A number of different ternary semiconductor systems are already in common use in devices: $Al_{1-x}Ga_xAs/GaAs$, $GaAs_{1-x}P_x/GaAs$, $GaAs_{1-x}P_x/GaP$, and $In_{1-x}Ga_xAs$ have been extensively employed. Different material systems may prove equally important in the future. Some of these layered structures involve layers of materials, e.g., ternary or quaternary materials differing only in the relative amounts of the constituent elements. For device applications, it would be very desirable to have composition-selective dry etching techniques that would discriminate between such similar materials. Unfortunately, many systems exhibit little or no change in chemical reactivity with composition change. Current dry etching techniques offer selectivity between GaAs and $Al_{1-x}Ga_xAs$ based on different chemical reactivities, but not between $Al_{1-x}Ga_xAs$ materials of different relative Al and Ga compositions. (K. Hikosaka, et al, *Jpn. J. Appl. Phys.* 20, L847 (1981). The situation is even worse for the $GaAs/GaAs_{1-x}P_x/GaP$ system, since the chemistries of GaAs and GaP are so similar.

Conventional dry etching processes for semiconductors, e.g., of the III–V-group involve Cl· or Cl— as the gas phase, "dry" reactant (G. Smolinsky et al, "Plasma Etching of III-V Compound Semiconductor Materials and Their Oxides", *J. Vac. Sci. Technol.* 18 (1981), 12–16). In the absence of light, these processes often do not exhibit significant or useful selectivity among III–V or other materials. This is especially the case when materials differ primarily only slightly in composition and thus have essentially the same chemical reactivity.

Dopant, concentration dependent, wet etching based on variations in sample bias voltage have been observed for Si (W. Kern, "Chemical Etching of Silicon, Germanium, Gallium Arsenide, and Gallium Phosphide", *RCA Review* 39 (1978) 278-308). For Si, a difference of two orders of magnitude in dopant concentration is required to produce useful differences in etch rate. Dopant concentration dependent wet etching of n-GaAs also has been observed (P.D. Greene, "Preferential Photoelectrochemical Dissolution of n-GaAs in Fe(III)-based Etches", *Proc. 6th Int. Symp. on Gallium Arsenide and Related Compounds*, Edinburgh, Sept. 20–22, 1976, p. 141–149). See also Kerr, supra. Voltage control of the rate of a wet etching process for n-GaAs has been reported (H. J. Hoffman et al., "Voltage-controlled Photoetching of GaAs", *Appl. Phys. Lett.* 38 (1981) 564–566).

Several photochemical wet etching processes have also been identified which produce preferential etching of n-type materials (R. W. Haisty, "Photoetching and Plating of Gallium Arsenide", *J. Electrochem. Soc.* 108, 790-4 (1961); F. Kuhn-Kuhnenfeld, "Selective Photoetching of Gallium Arsenide", *J. Electrochem. Soc.* 119, 1063-8 (1972); and R. M. Osgood, Jr., "Localized Laser Etching of Compound Semiconductors in Aqueous Solution", *Appl. Phys. Lett.* 40, 391-3 (1982)). A photochemical preferential wet etchant for p-GaP has been reported (W. H. Hackett, Jr., et al., "A Scanning Electron Microscope Investigation of Etching Phenomena in GaP Electroluminescent Diodes", *J. Electrochem. Soc.* 119, 973-6 (1972)).

However, in none of these disclosures was there any suggestion of a photochemical dry etching selectivity based solely on small compositional differences.

Such selective dry etching processes would be extremely useful in the fabrication of semiconductor devices (especially III–V devices where the problem is most severe) since dry processes offer several well-known advantages over wet processes for commercial production (R. G. Poulsen, "Plasma Etching in Integrated Circuit Manufacture-A Review", *J. Vac. Sci. Technol.* 14, 266-74 (1977)).

Many conventional processes are known for etching a wide variety of substrates and for photopatterning substrates using photoresists and other techniques. However, the details of the etching steps of these methods are unrelated to the problem of selectively etching semiconductor substrates according to composition. As a sampling, see, e.g., U.S. Pat. Nos. 4,478,677; 4,414,059; 4,320,191; and 4,252,891. Similarly unrelated is U.S. Pat. No. 4,404,072 disclosing a photoelectrochemical wet etching technique. No selective etching between different semiconductor materials is reported. Similar disclosures involving details of etching techniques which do not achieve any selection between semiconductor materials also include U.S. Pat. Nos. 4,351,706; 4,454,004; 3,364,087; 4,326,911; and 4,331,504.

Although some of the very basic aspects of dry etching processes are known, e.g., the relationship between bandgap and photon energies in photochemical etching of Si by $XeF_2$ (Houle - "Non-thermal Effects in Laser-Enhanced Etching of Si by $XeF_2$", *Chem. Phys. Lett.* 95 (1983) 5–8), selective dry etching techniques have not been disclosed heretofore.

All of the disclosures cited above are incorporated by reference herein.

SUMMARY OF THE INVENTION

Accordingly, it is an object of this invention to provide a method for the selective dry etching of one semiconductor material in the presence of another.

It is another object of this invention to provide such a selective technique for etching a semiconductor material of one composition and bandgap in the presence of a semiconductor material of another composition even only slightly different, and hence another bandgap.

It is a further object of this invention to provide such a selective dry etching process which incorporates the advantages known for dry etching processes over wet etching processes and which achieves selectivity with minimized suppression of the etching rate in the semiconductor material which undergoes the preferential dry etching.

Upon further study of the specification and appended claims, further objects and advantages of this invention will become apparent to those skilled in the art.

These objects have been attained by providing a method of selectively photochemically dry etching a first semiconductor material of a given composition and direct bandgap $Eg_1$ in the presence of a second semiconductor material of a different composition and direct bandgap $Eg_2$, wherein $Eg_2 > Eg_1$, said second semiconductor material substantially not being etched, comprising subjecting both materials to the same photon flux and to the same gaseous etchant under conditions where said etchant would be ineffective for chemical etching were the photons not present, said photons being of an energy greater than $Eg_1$ but less than $Eg_2$, whereby said first semiconductor material is photochemically etched and said second material is not etched.

DETAILED DISCUSSION

Even in those systems that exhibit little variation in chemical reactivity with changing composition, the semiconductor bandgap does change appreciably as the composition changes. This is the basis of the approach of this invention to achieving a high degree of etching selectivity between materials of slightly different compositions. It has been discovered that the difference in bandgap between two materials of differing composition can be used to control etching; thus, it is now possible to achieve a level of selectivity of potentially great utility in fabricating devices.

A key discovery upon which this invention is based is the fact that the effect of light on the etching process of interest is essentially purely photochemical and not thermal in nature for appropriate low and moderate levels of irradiation. This fact was not heretofore known, especially in III-V semiconductor materials. Accordingly, it was not previously predictable that photochemical dry etching processes could be rendered selective based on controlled selection of semiconductor electronic properties, especially in III-V semiconductors. See, e.g., a publication of this aspect of the invention by Ashby, *Appl. Phys. Lett.*, 45 (8) Oct. 15, 1984, 892. In this application, the electronic properties which serve to provide the basis for selective etching are bandgap-based absorptions of photons. Using the principles of this invention, for the first time, extremely high selectivities in etching have been achieved, e.g., for III-V materials differing by only a factor of 100 or 10 or even less in absorption coefficient at the photon wavelength utilized.

Although this invention is particularly applicable to the important class of III-V semiconductor materials, it is not limited to these materials (B, Al, Ga, In, Tl, N, P, As, Sb, Bi). It can be utilized in any systems where the principles discussed herein are applicable, including Group IV semiconductors (Si, Ge), II-VI semiconductors, II-IV semiconductors, combinations thereof, etc. While an important application is in the binary semiconductors, most notably GaAs, it is fully applicable to ternary, quaternary and higher semiconductor systems, including the well known families of $Al_{1-x}Ga_xAs$/GaAs, $Al_{1-x}Ga_xAs$, $GaAs_{1-x}P_x$/GaAs, $GaAs_{1-x}P_x$, $GaAs_{1-x}P_x$/GaP, or $In_{1-x}Ga_xAs$, and many others, as well as to single element semiconductors, e.g., those mentioned above.

A key aspect of this invention is the maintenance in the etching process of conditions which ensure that dry (i.e., non-liquid, i.e., gaseous-etchant-based) photochemical (i.e., requiring both the gaseous, chemical etchant species and actinic radiation) etching is the predominant, essentially only or, in fact, only etching mechanism ongoing in the system of interest. The more exclusive is dry photochemical etching vis-a-vis other non-selective etching mechanisms, e.g., thermal-based or purely chemical-based etching, the higher will be the selectivity in accordance with this invention. Consequently, the ambient conditions of the semiconductor materials will be selected such that the active etchant species will not effectively etch the semiconductor materials in the absence of the applied actinic radiation, i.e., photon flux greater than the bandgap energy of the material to be etched and not greater than the bandgap energy of the material in which etching is to be suppressed. In accordance with this invention, the materials involved will have different chemical compositions (even only slightly different) and hence different bandgaps (even only slightly different). With respect to selective etching of semiconductor materials having different dopant-types or dopant concentrations, reference is made to commonly assigned, co-pending application Ser. No. 786,563, filed of even date.

Appropriate ambient conditions can readily be determined by one of skill in the art using routine preliminary experiments to determine the appropriate combination of parameters which will preclude non-photochemical etching, e.g., flow rates, vacuum levels, active etchant species (plasma) generation, identity and concentration, residence time of the active species on the semiconductor surface, flux and wavelength of the selected radiation to be applied, polarity and strength of any bias voltage applied to the semiconductor materials, size, geometrical and configurational details, apparatus, etc. A key factor is the selection of active species concentrations sufficiently low under the applied conditions that negligible purely thermal/chemical etching of the substrates occurs in the absence of the radiation of the selected flux. Whether some minimal amount of non-photochemical etching is tolerable will be application-selective and will be well known to those skilled in the art in view of the details and guidance of this disclosure.

In general, if the degree of photochemical etching is a factor of 100 greater than other etching mechanisms, the effects of the latter will be essentially negligible in this invention for most applications. However, photochemical/other etching mechanism ratios lower or higher than 100/1, of course, are also includable within the scope of this invention.

The identity of the etchant gaseous species is not per se critical and will be routinely selected by those of skill in the art in accordance with the chemical composition of the semiconductor materials of interest. Throughout this application, the term "dry etching" refers to gas/solid phase etching. For III-V semiconductors, the conventional ($Cl\cdot$, $Cl^-$) gaseous species are very suitable. Other halides (e.g., Br, I) are also suitable for these materials. For materials based on elements in other than III-V groups, appropriate etchants are similarly well known and applicable herein. See, e.g., the many references discussed and incorporated by reference above, as well as many others.

The wavelength of the actinic radiation will be selected such that the photon energy is greater than the direct bandgap of the semiconductor material in which etching is desired. The photon flux performs its known function of generating active species at the surface of the semiconductor material, e.g., electron-hole pairs, which effectuate the etching reaction with the active chemical etching species. The wavelength must be selected to generate a sufficient concentration of such electronic species sufficiently quickly that the resultant degree of recombination of these active species in the semiconductor material is not so large that etching is precluded or unacceptably deleteriously affected. As a result, the wavelength generally must be chosen to correspond to that of the direct gap of the semiconductor material(s) and not, e.g., to that of the indirect gap where absorption coefficients are several orders of magnitude lower. The upper limit on the energy of the photons, of course, is set by the lowest photon energy which will achieve a concentration of active species, such as electron-hole pairs, effective to cause substantial etching in the higher bandgap material in which it is desired not to cause etching. Also, the total fluence impinging on the semiconductor materials must not be so large that unacceptable damage results or other non-photochemical etching mechanisms are activated to unacceptable levels.

In general, under given atmospheric, electrical and configurational conditions, the photochemical etching rate for a given etchant will vary linearly with the photon flux. The magnitude of the flux per se is not critical and generally will be in the range of about 10 watts/cm$^2$ or lower to several thousand watts/cm$^2$ or higher. At the low end, there generally will be observed a minimum flux below which the degree of photochemical etching will be too low to achieve satisfactory selectivity.

Of course, any appropriate source of the necessary photons can be utilized. In general, laser radiation is preferred; however, other high intensity sources can also be very useful. Furthermore, irradiation can be applied to the material surfaces in patterned, imaged form whereby photopatterning of semiconductor materials can be effected in accordance with this invention utilizing the conventional optical imaging systems and techniques which are so highly conventional in semiconductor device fabrication.

The duration of the etching treatment will be selected to achieve an etch of the desired depth. Appropriate times can readily be determined in accordance with routine preliminary experiments which will be application specific. Reference is made to the examples herein. For example, a depth as large as 1 um was achieved in a ½ hour etching experiment in GaAs using a laser radiating at 514 nm and having an intensity of 2000 W/cm$^2$. As another example, under reaction conditions and a photon energy where GaAsP material has an absorption coefficient on the order of $10^4$ (0.04 ev greater than its direct bandgap) and another GaAsP material has an absorption coefficient on the order of $10^3$, excellent etching is observed for the former and essentially no etching for the latter.

In some materials it may be desirable to control the etching process by application of a conventional bias voltage to the semiconductor materials. This will have an effect on the electron-hole band structure as described in related application Ser. No. 786,563, e.g., it adds another layer of control over the method of this invention, thereby increasing its latitude of applicability. The precise voltage is not critical and can be up to several hundred volts. The upper limit is determined by the point at which the voltage becomes incompatible with other requirements of the etching system. Typically, the upper limit is determined by the need to avoid the formation of a plasma directly above the semiconductor materials. Generation of the bias voltage, of course, is highly conventional for semiconductor materials. The polarity and strength of the bias voltage will be used to determine the selectivity of etching for the given application as discussed in the mentioned related application.

The etching depth, in essence, is controlled by the total radiation fluence in a given experiment. The latter, of course, can be routinely controlled by controlling radiation flux and/or duration under otherwise constant conditions.

As can be seen from the foregoing, when utilizing the details of this invention in conjunction with imaged radiation, semiconductors can be photopatterned under very desirable conditions. For example, photoresists can be eliminated. The resolution of such photopatterning in accordance with this invention is essentially only optically and electrically limited, i.e., due to the defraction limit and/or broadening caused by underlying electronic mechanisms ongoing in the semiconductors' surface, e.g., carrier diffusion mechanisms.

In a typical configuration for carrying out the method of this invention, the sample is situated downstream of a plasma cell. The latter is conventionally operatively associated with reactant gas sources. The plasma cell is used to generate reactive Cl species (e.g., Cl· and Cl$^-$) from conventional Cl-containing gases, including Cl$_2$, HCl, CH$_{4-x}$Cl$_x$, where x is 1–4, or other compounds which decompose to produce the mentioned active species in a plasma. Generally, a dc plasma is generated between parallel plates. Of course, alternative plasma generation techniques can also be utilized to provide the reactant source, e.g., rf, cold cathode techniques, etc. Where plasmas are not needed to generate the necessary gaseous reactants, of course, the plasma cell can be eliminated. The active species reactants then flow past the sample chamber to a conventional pumping system which creates the flow.

As discussed above, the system parameters are selected so that the Cl-species or other etchant-species concentrations are maintained sufficiently low to produce negligible non-photochemical etching of the substrate, i.e., they are chosen to produce negligible etching in the absence of photons in comparison with the amount of photochemical etching which is achieved. The sample chamber is conventionally configured with means for irradiating the sample with a conventional photon source which can be imaged. Regardless of a material's bandgap, the substrate will exhibit etching only in the regions illuminated with bandgap or higher energy photons under the appropriate balance of photon flux and reactive etchant species concentrations. The voltage similarly will be selected in accordance with the principles discussed above and in the mentioned related application. That required in a given case to enhance the necessary selectivity will depend on the conductivity of the gas in the region of the sample, dopant concentration, etc.

The composition-selective photochemical etch of this invention is very useful in the fabrication of a variety of semiconductor heterostructure devices for example in devices containing a buried layer which needs to be contacted for proper operation. Two non-limiting examples of such devices include heterojunction bipolar transistors and photodetectors with window layers. This invention can also be used to examine a layered heterostructure by etching away one layer at a time.

A particularly notable field of use is in conjunction with devices incorporating strained layer superlattices (SLS). These layered materials generally involve a series of layers of at least two different compositions differing only slightly from one another and having different bandgaps. Many devices employing SLS structures, such as SLS diode lasers, will benefit from the etching selectivity of this invention, e.g., for preferentially removing substrate or buffer layers. For details, e.g., U.S. applications Ser. Nos. 477,698 of Mar. 22, 1983; 539,367 of Oct. 6, 1983; 602,109 of Apr. 19, 1984; and 512,059 of July 28, 1983 and U.S. Pat. No. 4,163,237, inter alia, which disclosures are incorporated by reference herein.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. In the preceding text and the following examples, all temperatures are set forth uncorrected in degrees Celsius and all parts and percentages are by weight; unless otherwise indicated.

The disclosures of certain publications of the inventors are incorporated by reference herein, viz., Ashby, *Appl. Phys. Lett.* 45 (8), Oct. 15, 1984, 892; Ashby, *Appl. Phys. Lett.* 46 (8), Apr. 15, 1985, 752; and Ashby et al., *Appl. Phys. Lett.* 47 (1), July 1, 1985, 62.

EXAMPLE 1

The samples were GaAs (100) from Crystal Specialties, Inc. No pretreatment to remove native oxide was employed. Carrier concentrations of $4.5 \times 10^{17}/cm^3$ and $7 \times 10^{17}/cm^3$ were measured for the Si-doped n-GaAs and Zn-doped p-GaAs, respectively. Reactions were run at a sample temperature of 370° K., unless otherwise specified, to facilitate evaporation of reaction products. The gas-phase Cl reactants were generated in a dc plasma located 10 cm upstream from the sample. The plasma electrodes were 316 stainless steel discs of 2.5 cm diameter separated by 1.0 cm. Voltage between the discs was $-370 \pm 5$ V, with an interelectrode current of 0.6 mA. Since moderate concentrations of Cl radicals and ions will etch GaAs in the absence of light, the Cl species concentrations were reduced to a level where no etching was detectable with a Dektak profilometer in the absence of light of energy greater than the bandgap of GaAs. This was achieved by dilution of HCl with He since a minimum pressure of nearly 1 Torr was required to sustain a glow discharge. The gas mixture employed was 3.00 Torr He with 0.11 Torr of 5% HCl in He. The He flow rate was 510 sccm, which corresponds to a mean velocity of 250 cm/s. Reactions were run for 1800 s. Although actual Cl species concentrations were not measured directly, the same pressure and plasma conditions were used for all runs to ensure the same supply of Cl reactants and, consequently, self-consistent reaction conditions for all measured etch rates.

The photon source was a focused Ar+ laser operated at 514.5 nm in the $TEM_{oo}$ mode. The beam dimensions were measured with a Reticon photodiode array with 25 μm resolution. The array was located at a position in the optical setup which corresponded to the sample surface. The beam was Gaussian with full width at half-maximum = $150 \pm 25$ μm. The laser power was set at a constant value and the power on the sample surface was varied by insertion of neutral density filters into the optical path. Laser power at the sample surface was varied from 0.056 to 0.22 W.

Etch profiles were measured with a Dektak profilometer. Etch rates were defined by the maximum etch depth measured at beam center for a 1800-s reaction. These rates do not represent the maximum rate possible, since no attempt was made to optimize reaction conditions.

Typical etch profiles showed a smooth Gaussian-shaped hole, which replicates the laser beam profile, etched in the GaAs sample. Extremely smooth holes are produced by this photoetching technique. This contrasts sharply with the rough holes produced by laser-assisted thermal etching. The etch depths produced by varying laser power were also measured for both p-GaAs and n-GaAs. For both dopant types, etch depth increases linearly with laser power. For a constant laser power, etch depth increases linearly with time with an intercept at zero, indicating that the initial presence of the thin layer of native oxide does not inhibit the photoreaction to any significant extent.

One would expect a purely photochemical reaction to exhibit linearity in laser power since the number of electron-hole pairs produced is proportional to the photon flux, which is determined by the laser power for constant beam dimensions. In fact, such linearity is observed. One would also expect to observe a dependence on laser power for a purely thermal reaction. However, this dependence in the thermal case would not be linear but, rather, would depend exponentially on the temperature rise induced at the GaAs surface for a given laser power. One may calculate the temperature rise at the surface of a material induced by a Gaussian laser beam of known profile and power. Neglecting power losses due to reflectance at the GaAs surface, the maximum calculated temperature rise at beam center for a laser power of 0.22 W is 26°, while a laser power of 0.056 W produces a maximum rise of 7°. An Arrhenius plot of the natural log of the experimental etch depths at beam center versus the reciprocal temperature of the sample was constructed. Two sets of data points represented the difference in temperature calculated assuming a reflectance of 0.0 or 0.39. The actual temperature of the samples should lie somewhere between these extremes. The plots made clear that marked curvature is present regardless of the actual value of the reflectance. Therefore, the Arrhenius behavior expected of a thermal process is absent in this photoinduced reaction. A study of the temperature dependence of the thermal reaction in a planar plasma reactor using $Cl_2$ as the source of reactive Cl species showed Arrhenius behavior over the temperature range from 490° to 580° K. with an experimental activation energy of 10.3 kcal/mole (Donnelly, et al., *J. Electrochem. Soc.* 129, 2533 (1982)). The expected temperature dependence of the etch depth if the laser were only increasing the thermal reaction rate was calculated. The lack of fit to the experimental etch depths is clear evidence of the existence of a nonthermal reaction mechanism. As a further test of the apparent temperature independence of the photoreaction, two samples of n-GaAs with carrier concentration of $1 \times 10^{18}/cm^3$ were heated to 361° and 384° K. and reacted under a laser power of 0.18 W, which gives a calculated maximum temperature rise of 21° to 382° and 405° K., respectively. This serves to simulate the calculated maximum temperature range for the samples reacted at different laser powers (377–396K). The measured etch rates for the samples at 361° and 384° K. were 4700±300 A and 4850±100 A, respectively. Thus, it is clear that the laser is not increasing the reaction rate of GaAs by merely heating the surface and thereby facilitating a thermally activated reaction. Although such purely photochemical effects have not been observed before in a dry etching process for GaAs, the laser-assisted formation of GaAs oxide under similar low power density laser radiation also appears to be photochemical rather than thermal in origin.

This example shows that GaAs exhibits greatly enhanced reactivity with gas-phase Cl species when the surface is irradiated with low-intensity laser light where the photon energy is greater than the bandgap of GaAs. The dependence of this reaction on laser power and temperature is inconsistent with a thermal process. Rather, the reaction of electron-hole pairs by laser irradiation induces a truly photochemical reaction of GaAs with the reactive gas-phase Cl species. This is the first observation of a purely photochemical dry etching process in a III–V semiconductor material.

EXAMPLE 2

The $GaAs_{1-x}P_x$ layers examined in this study were prepared by metalorganic chemical vapor deposition (MOCVD) in a known system. The alloy layers were grown at 973° K. on (100) GaAs substrates doped n type with Si to a level of about $1\times10^{18}/cm^3$. The net carrier concentration in the undoped $GaAs_{0.8}P_{0.2}$ was found to be $4\times10^{15}/cm^3$ n type. The carrier concentrations were determined by using a Miller Feedback Profiler Plotter. The composition of the alloys was determined by x-ray dfifraction in combination with Vegard's law. The layer thicknesses, 2.1 and 2.6 μm for the lower and higher P content samples respectively, were determined by an angle-lapping technique. The n-GaAs (100, $(2.5-5\times10^{17}/cm^3)$ was obtained from Crystal Specialties, Inc.

The principal etchant species in the photochemical process were Cl atoms, which were generated using a dc glow discharge located well upstream from the sample position. The apparatus and reaction conditions were similar to those reported previously from the photochemical etching of GaAs Ser. No. 786,563, with the following exceptions. The voltage between the discharge electrodes was −400±10 V. The gas mixture employed was 0.2% HCl in He with a total pressure of 3.3 Torr. Substrate temperature in the absence of laser radiation for these reactions was 377°±1° K. The calculated maximum temperature rise under irradiation was 23° K. at beam center, giving an approximate reaction temperature of 400° K. Etching rates were measured at two wavelengths: 514.5 nm (2.41 eV) and 766 nm (1.62 eV). The 2.41-eV light was provided by a focused Ar+ laser operated in the TEM$_{00}$ mode with FWHM of 150±25 μm at the sample. This laser was used to pump a dye (Exciton LDS 751) for output at 1.62 eV with an elongated beam shape of ∼500×700 μm at the sample and a distorted Gaussian cross section. The dye laser optics did not permit extending these studies to longer wavelengths to reach the energy region lower than the band gap of $GaAs_{0.8}P_{0.2}$ but higher than the band gap of GaAs. A total power of 0.20 W was used at each wavelength. The etch depths after a 1800-s reaction were measured with a Dektak profilometer. Etch rates were defined by the maximum etch depth. No evidence of etching was observed in areas of the samples not illuminated by the laser beam. The etching conditions of this process were deliberately chosen to produce negligible etching in the dark. The utility of any selective photochemical process will be reduced if the selected reaction conditions produce dark etching at rates comparable to photochemical etching.

Although direct quantitative comparisons of the etch rates of the three materials at a given photon energy are possible, similar comparisons between the etched depths of a single material at the two different photon energies are not meaningful due to the irregular shape of the dye laser beam. The results of these experiments are presented in Table I and represent quantum yields on the order of $10^{-6}$ atoms per incident photon.

TABLE 1

| Photon energy (eV) | Etch depth (1000 A) after 1800-s reaction. | | |
|---|---|---|---|
| | GaAs | $GaAs_{0.8}P_{0.2}$ | $GaAs_{0.63}P_{0.37}$ |
| 1.62 | 3.9 ± 0.4 | 4.0 ± 0.3 | 0.0 ± 0.4 |
| 2.41 | 4.7 ± 0.3 | 3.2 ± 0.3 | 3.2 ± 0.4 |

For the photochemical etching reaction to proceed, it is necessary to produce a sufficient quantity of electrons and holes within a short distance from the surface so the carriers can reach the surface and participate in the reaction before loss processes, such as recombination, destroy them. In the mentioned previous work with GaAs, the ratio of Ga and As atoms removed to the number of incident photons was ∼1 in $10^5$–$10^6$. This low quantum yield means that a relatively high ($>10^4$/cm) absorption coefficient is required for the photon flux employed in these studies to produce a sufficient number of electrons and holes in the near-surface region to give appreciable etching. This magnitude of absorption coefficient occurs for photons with energies equal to or in excess of the direct bandgap of GaAs or $GaAs_{1-x}P_x$.

The bandgaps at 400° K. for the three materials employed in this study can be calculated from the literature values at 300° K. and the temperature dependence of $-4\times10^{-4}$ eV/K. The respective gaps at 400° K. are the following: GaAs, 1.38 eV; $GaAs_{0.8}P_{0.2}$, 1.58 eV; $GaAs_{0.63}P_{0.37}$, 1.80 eV.

The 1.62-eV (766-nm) photons possess energy in excess of the bandgaps of GaAs and $GaAs_{0.8}P_{0.2}$. The results in Table I show that both of these materials photoetch at essentially the same rate under illumination with 1.62-eV photons. However, the samples of $GaAs_{0.63}P_{0.37}$ that have a bandgap (1.80 eV) greater than the photon energy (1.62 eV) do not etch within detection limits. In contrast, the 2.42-eV (514.5-nm) photons, which possess energy in excess of the bandgaps of all three materials, etch all three materials. The two $GaAs_{1-x}P_x$ materials etch at the same rate, whereas GaAs etches at a slightly higher rate. The origin of this difference remains to be determined.

For an etching process to be most useful in a device fabrication, it is important for the stoichiometry of the etched regions to remain the same as the stoichiometry of the adjacent unetched regions. To determine whether this selective photochemical etching process alters the stoichiometry of the etched region, Auger spectra were taken of a $GaAs_{0.8}P_{0.2}$ sample in the etched hole and in adjacent unetched areas. No difference was observed in the Ga:As:P ratios for the two regions within experimental uncertainty. In addition, scanning Auger spectra using low electron doses to prevent surface Cl loss through electron-stimulated desorption were taken in both etched and unetched regions. No evidence for the presence of Cl was observed, indicating any Cl retained in the material after etching is present at less than a 1 at. % level in the analyzed depth of approximately four to five atomic surface layers.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A method of selectively photochemically dry etching a first semiconductor material of a given composition and direct bandgap $Eg_1$ in the presence of a second semiconductor material of a different composition and direct bandgap $Eg_2$, wherein $Eg_2 > Eg_1$, said second semiconductor material substantially not being etched during said method, comprising
   subjecting both materials to the same photon flux and to the same gaseous etchant under conditions where said etchant would be ineffective for chemical etching of either material were the photons not present,
   said photons being of an energy greater than $Eg_1$ but less than $Eg_2$, whereby said first semiconductor material is photochemically etched and said second material is substantially not etched.

2. A method of claim 1 wherein said semiconductor materials are binary, ternary or quaternary materials.

3. A method of claim 2 wherein said semiconductor materials are composed of the same III-V elements but differ in the relative amounts of at least two elements.

4. A method of claim 3 wherein said semiconductor materials are both in one of the families of $Al_{1-x}Ga_x$-As/GaAs, $Al_{1-x}Ga_xAs$, $GaAs_{1-x}P_x$/GaAs, $GaAs_{1-x}P_x$/GaP, $GaAs_{1-x}P_x$ or $In_{1-x}Ga_xAs$.

5. A method of claim 4 wherein both semiconductors are in the $GaAs_{1-x}P_x$ family.

6. A method of claim 3 wherein the etchant is a Cl·/Cl⁻-containing gas.

7. A method of claim 1 wherein said semiconductor materials are subjected to an applied bias voltage.

8. A method of claim 1 wherein said semiconductor materials are part of a strained layer superlattice.

9. A method of claim 1 wherein said photon flux is irradiated in an imaged pattern.

10. A method of claim 1 wherein said semiconductor substrates are part of the same semiconductor device.

11. A method of claim 1 wherein the photon flux is provided by a laser.

12. A method of claim 1 wherein $Eg_2$ is greater than $Eg_1$ by a factor of 100 or more.

13. A method of claim 1 wherein $Eg_2$ is greater than $Eg_1$ by a factor of 10 or more.

14. A method of claim 1 wherein the semiconductor materials are ternary.

15. A method of selectively photochemically dry etching a first semiconductor material of a given composition and direct bandgap $Eg_1$ in the presence of a second semiconductor material of a different composition and direct bandgap $Eg_2$, wherein $Eg_2 > Eg_1$, said second semiconductor material substantially not being etched during said method, comprising
   subjecting both materials to the same photon flux and to the same gaseous etchant under conditions where said etchant would be ineffective for chemical etching were the photons not present,
   the absorption coefficient of said second material for said photons being sufficiently less than the absorption coefficient of said first material for said photons that said first material is etched and said second material substantially is not etched.

* * * * *